(12) United States Patent
Chen et al.

(10) Patent No.: US 9,199,854 B2
(45) Date of Patent: Dec. 1, 2015

(54) METHOD OF MANUFACTURE

(75) Inventors: Ying Chen, Waurn Ponds (AU); Luhua Li, Waurn Ponds (AU)

(73) Assignee: Deakin University, Waurn Ponds, Victoria ( * ) Notice: Subject to any disclaimer, the term of this patent is extended or adjusted under 35 U.S.C. 154(b) by 519 days.

(21) Appl. No.: 13/497,221

(22) PCT Filed: Sep. 20, 2010

(86) PCT No.: PCT/AU2010/001226
§ 371 (c)(1),
(2), (4) Date: Oct. 9, 2012

(87) PCT Pub. No.: WO2011/032231
PCT Pub. Date: Mar. 24, 2011

(65) Prior Publication Data
US 2013/0029131 A1    Jan. 31, 2013

(30) Foreign Application Priority Data

Sep. 21, 2009   (AU) .................................. 2009904566

(51) Int. Cl.
*C01B 35/14*    (2006.01)
*B82Y 30/00*    (2011.01)
(Continued)

(52) U.S. Cl.
CPC ............ *C01B 35/146* (2013.01); *B82Y 30/00* (2013.01); *C01B 21/0641* (2013.01); *C04B 35/6229* (2013.01); *C04B 35/6261* (2013.01); *C04B 35/6265* (2013.01); *C10M 103/06* (2013.01); *C23C 24/08* (2013.01); *C23C 26/00* (2013.01); *C30B 25/00* (2013.01); *C30B 29/403* (2013.01); *C30B 29/602* (2013.01); *C01P 2002/72* (2013.01); *C01P 2002/85* (2013.01); *C01P 2004/03* (2013.01); *C01P 2004/04* (2013.01); *C01P 2004/13* (2013.01); *C01P 2004/16* (2013.01); *C04B 2235/3241* (2013.01);
(Continued)

(58) Field of Classification Search
USPC .......................................... 427/301; 501/96.2
See application file for complete search history.

(56) References Cited

U.S. PATENT DOCUMENTS 4,707,556 A   11/1987  Paciorek
7,479,516 B2   1/2009  Chen

FOREIGN PATENT DOCUMENTS

CN    1424254         6/2003
JP    56-096706 A     8/1981
(Continued)

OTHER PUBLICATIONS

International Search Report and Written Opinion of International Patent Application No. PCT/AU2010/001226, mailed Nov. 30, 2010, 8 pages.
(Continued)

*Primary Examiner* — Nathan T Leong
(74) *Attorney, Agent, or Firm* — Fish & Richardson P.C.

(57) ABSTRACT

A process for producing boron nitride nanotubes and nanotube films, which process comprises heating a liquid composition comprising boron particles and a metal compound, wherein heating takes place at a temperature of from 800-1300° C. in a gaseous atmosphere containing nitrogen that causes boron nitride nanotubes to grow, and wherein the boron particles have an average particle size of less than 100 nm, and wherein the metal compound is selected such that it promotes the growth of boron nitride nanotubes during heating.

13 Claims, 7 Drawing Sheets a) Ball-milling    b) B ink    c) Painting    d) Annealing

(51) Int. Cl.
C01B 21/064 (2006.01)
C10M 103/06 (2006.01)
C23C 24/08 (2006.01)
C23C 26/00 (2006.01)
C30B 25/00 (2006.01)
C30B 29/40 (2006.01)
C30B 29/60 (2006.01)
C04B 35/622 (2006.01)
C04B 35/626 (2006.01)

(52) U.S. Cl.
CPC . C04B2235/3256 (2013.01); C04B 2235/3258 (2013.01); C04B 2235/3272 (2013.01); C04B 2235/3275 (2013.01); C04B 2235/3279 (2013.01); C04B 2235/405 (2013.01); C04B 2235/421 (2013.01); C04B 2235/443 (2013.01); C04B 2235/46 (2013.01); C04B 2235/5284 (2013.01); C04B 2235/5454 (2013.01); C10M 2201/061 (2013.01); C10M 2201/087 (2013.01); C10N 2220/082 (2013.01); Y10T 428/25 (2015.01)

(56) References Cited

FOREIGN PATENT DOCUMENTS

| | | |
|---|---|---|
| JP | 64-000087 A | 1/1989 |
| JP | 01-278404 A | 11/1989 |
| JP | 2003-192314 A | 7/2003 |
| JP | 2004-182571 A | 7/2004 |
| JP | 2004-231455 | 8/2004 |
| JP | 2005-200286 A | 7/2005 |
| JP | 2007-516314 A | 6/2007 |
| JP | 2007-231031 A | 9/2007 |

OTHER PUBLICATIONS

International Preliminary Report on Patentability of International Patent Application No. PCT/AU2010/001226, mailed Mar. 27, 2012, 5 pages.
J. J. Fu et al. "The synthesis of boron nitride nanotubes by an extended vapour-liquid-solid method" Nanotechnology 15 (2004), pp. 727-730, Apr. 8, 2004.
Chunyi Zhi et al. "Effective precursor for high yield synthesis of pure BN nanotubes" Solid State Communications 135 (2005), pp. 67-70.
Y. Chen et al. "Synthesis of boron nitride nanotubes at low temperatures using reactive ball milling" Chemical Physics Letters 299 (1999) pp. 260-264, Jan. 11, 1999.
X. Blase et al. "Stability and Band Gap Constancy of Boron Nitride Nanotubes" Europhysics Letters 28 (51), pp. 335-340, 1994.
Ralf Blossey "Self-cleaning surfaces—virtual realities" Nature Materials vol. 2, May 2003, pp. 301-306.
Anyuan Cao et al. "Multifunctional brushes made from carbon nanotubes" Nature Materials vol. 4, Jul. 2005, pp. 540-545.
C.W. Chang et al. "Isotope Effect on the Thermal Conductivity of Boron Nitride Nanotubes" Physical Review Letters PRL 97, 085901 (2006), 4 pages.
Hua Chen et al. "Eu-doped Boron Nitride Nanotubes as a Nanometer-Sized Visible-Light Source" Adv. Mater. 2007, 19, pp. 1845-1848.
Ying Chen et al. "A solid-state process for formation of boron nitride nanotubes" Applied Physics Letters vol. 74, No. 20, May 17, 1999, pp. 2960-2962.
Ying Chen et al. "Boron nitride nanotubes: Pronounced resistance to oxidation" Applied Physics Letters vol. 84, No. 13, Mar. 29, 2004, pp. 2430-2432.
Y. Chen et al. "The nucleation and growth of carbon nanotubes in a mechano-thermal process" Carbon 42 (2004), pp. 1543-1548.
Y. Chen et al. "Synthesis of boron nitride nanotubes at low temperatures using reactive ball milling" Chemical Physics Letters 299 (1999), pp. 260-264.

Hua Chen et al. "Over 1.0 mm-long boron nitride nanotubes" Chemical Physics Letters 463 (2008), pp. 130-133.
Jun Yu et al. "Narrowed bandgaps and stronger excitonic effects from small boron nitride nanotubes" Chemical Physics Letters 476 (2009), pp. 240-243.
Y. Chen et al. "Largequantity production of highyield boron nitride nanotubes" Journal of Materials Research, vol. 17, Issue 08, 2002, pp. 1896-1899.
Y. Chen et al. "Improved growth of aligned carbon nanotubes by mechanical activation" Journal of Materials Research, vol. 19, Issue 10, 2004, pp. 2791-2794.
Y. Chen et al "Influence of milling temperature and atmosphere on the synthesis of iron nitrides by ball milling" Materials Science and Engineering A206 (1996), pp. 24-29.
Yong Jun Chen et al. "An effective approach to grow boron nitride nanowires directly on stainless-steel substrates" Nanotechnology 17 (2006), pp. 2942-2946.
Chwee-Lin Choong et al. "Review: carbon nanotube for microfluidic lab-on-a-chip application" Int J Mater Form (2008) 1: pp. 117-125.
Nasreen G. Chopra et al. "Boron Nitride Nanotubes" Science vol. 269, Aug. 18, 1995, pp. 966-967.
John Cumings et al. "Mass-production of boron nitride double-wall nanotubes and nanococoons" Chemical Physics Letters 316, 2000, pp. 211-216.
Lin Feng et al. "A Super-Hydrophobic and Super-Oleophilic Coating Mesh Film for the Separation of Oil and Water" Angew. Chem. Int. Ed. 2004, 43, pp. 2012-2014.
D. Golberg et al. "Unique morphologies of boron nitride nanotubes" Applied Physics Letters vol. 79, No. 3, Jul. 16, 2001, pp. 415-417.
D. Golberg et al. "Synthesis and Characterization of Ropes Made of BN Multiwalled Nanotubes" Scripta mater. 44 (2001), pp. 1561-1565.
L Guo et al. "Selective growth of boron nitride nanotubes by plasma-enhanced chemical vapor deposition at low substrate temperature" Nanotechnology 19 (2008) 065601 (6pp).
L. Guo et al. "Catalytic growth of boron nitride nanotubes using gas precursors" Physica E 41(2009), pp. 448-453.
J.J. Hu et al. "Tribological behavior and graphitization of carbon nanotubes grown on 440C stainless steel" Tribology Letters, vol. 19, No. 2, Jun. 2005, pp. 119-125.
Sumio Iijima "Carbon nanotubes: past, present, and future" Physica B 323 (2002), pp. 1-5.
P. Jaffrennou et al. "Near-band-edge recombinations in multiwalled boron nitride nanotubes: Cathodoluminescence and photoluminescence spectroscopy measurements" Physical Review B 77, 235422, 2008, 7 pages.
K. H. Khoo et al. "Tuning the electronic properties of boron nitride nanotubes with transverse electric fields: A giant dc Stark effect" Physical Review B 69, 201401 (R), 2004, 4 pages.
Hannes Kind et al. "Printing Gel-like Catalysts for the Directed Growth of Multiwall Carbon Nanotubes" Langmuir 2000, 16, pp. 6877-6883.
Christian Klinke et al. "Enhanced Field Emission from Multiwall Carbon Nanotube Films by Secondary Growth" J. Phys. Chem. B 2005,109, pp. 21677-21680.
Aurélie Lafuma et al. "Superhydrophobic states" nature materials, vol. 2, Jul. 2003, pp. 457-460.
Kenneth K. S. Lau et al. "Superhydrophobic Carbon Nanotube Forests" Nano Letters, 2003, vol. 3, No. 12, pp. 1701-1705.
Thomas Laudea et al. "Long ropes of boron nitride nanotubes grown by a continuous laser heating" Applied Physics Letters vol. 76, No. 22, May 29, 2000, pp. 3239-3241.
J. S. Lauret et al. "Optical Transitions in Single-Wall Boron Nitride Nanotubes" Physical Review Letters 94, 037405 (2005), 4 pages.
Chee Huei Lee et al. "Superhydrophobicity of Boron Nitride Nanotubes Grown on Silicon Substrates" Langmuir 2009, 25(9), pp. 4853-4860.
R. S. Lee et al. "Catalyst-free synthesis of boron nitride single-wall nanotubes with a preferred zig-zag configuration" Physical Review B, vol. 64, 121405(R), 4 pages, 2001.
Yanjiao Li et al. "Synthesis of boron nitride nanotubes from boron oxide by ball milling and annealing process" Materials Letters 63 (2009), pp. 1733-1736.

(56) References Cited

OTHER PUBLICATIONS

San Hua Lim et al. "Synthesis of boron nitride nanotubes and its hydrogen uptake" Catalysis Today 120 (2007), pp. 346-350.
Yi Lin et al. "Advances toward bioapplications of carbon nanotubes" J. Mater. Chem., 2004, 14, pp. 527-541.
Quoc Ngo et al. "Thermal Interface Properties of Cu-filled Vertically Aligned Carbon Nanofiber Arrays" Nano Letters 2004 vol. 4, No. 12, pp. 2403-2407.
Jang-Ung Park et al. "High-resolution electrohydrodynamic jet printing" nature materials vol. 6, Oct. 2007, pp. 782-789.
Yi-Tao Liu et al. "Gas flow directed assembly of carbon nanotubes into horizontal arrays" Materials Letters 61 (2007), pp. 334-338.
Oleg R. Lourie et al. "CVD Growth of Boron Nitride Nanotubes" Chem. Mater. 2000, 12, pp. 1808-1810.
Fushen Lu et al. "Advances in Bioapplications of Carbon Nanotubes" Adv. Mater. 2009, 21, pp. 139-152.
E. J. Mele et al. "Electric Polarization of Heteropolar Nanotubes as a Geometric Phase" Physical Review Letters, vol. 88, No. 5, Feb. 4, 2002, 056803, 4 pages.
P. J. Michalski et al. "Continuum Theory for Nanotube Piezoelectricity" Physical Review Letters 95, 116803, Sep. 9, 2005, 4 pages.
Cheol-Hwan Park et al. "Excitons and Many-Electron Effects in the Optical Response of Single-Walled Boron Nitride Nanotubes" Physical Review Letters 96, 126105 (2006), Mar. 31, 2006, 4 pages.
Liangti Qu et al. "Carbon Nanotube Arrays with Strong Shear Binding-On and Easy Normal Lifting-Off" Science Oct. 10, 2008 vol. 322, pp. 238-242.
S K Singhal et al. "Synthesis and characterization of boron nitride nanotubes using a simple chemical method" Indian Journal of Engineering & Materials Science vol. 15 Oct. 2008, pp. 419-424.
Rasmus Zink Sorensen et al. "Catalytic ammonia decomposition: miniaturized production of COx-free hydrogen for fuel cells" Catalysis Communications 6 (2005), pp. 229-232.
Abhijit P. Suryavanshi et al. "Elastic modulus and resonance behavior of boron nitride nanotubes" Appl. Phys. Lett., vol. 84, No. 14, Apr. 4, 2004, pp. 2527-2529.
Chengchun Tang et al. "A novel precursor for synthesis of pure boron nitride nanotubes" Chem. Commun., 2002, pp. 1290-1291.
C.C. Tang et al. "Effective growth of boron nitride nanotubes" Chemical Physics Letters 356 (2002), pp. 254-258.
M. Terrones et al. "Pure and doped boron nitride nanotubes" materialstoday May 2007, vol. 10, No. 5, pp. 30-38.
Kaoru Tsujii et al. "Super Oil-Repellent Surfaces" Angew. Chem. Int. Ed. Engl. 1997 36 No. 9, pp. 1011-1012.
J. J. Vela zquez-Salazar et al. "Synthesis and state of art characterization of BN bamboo-like nanotubes: Evidence of a root growth mechanism catalyzed by Fe" Chemical Physics Letters 416 (2005), pp. 342-348.
K. Wieczorek-Ciurowa et al. "The Thermal Decomposition of $Fe(NO_3)_3 \times 9H_2O$" Journal of Thermal Analysis and Calorimetry, vol. 58 (1999), pp. 647-651.
Y. Xiao et al. "Specific heat and quantized thermal conductance of single-walled boron nitride nanotubes" Physical Review B 69, 205415 (2004), 5 pages.
Huijun Xin et al. "Directional Orientation of Carbon Nanotubes on Surfaces Using a Gas Flow Cell" Nano Letters 2004 vol. 4, No. 8, pp. 1481-1484.
Yuan Xu et al. "Thermal properties of carbon nanotube array used for integrated circuit cooling" Journal of Applied Physics 100, 074302, 2006, 6 pages.
Yamamoto et al. "Tribological Properties of Single-Walled Carbon Nanotube Solids" Journal of Nanoscience and Nanotechnology, vol. 8, No. 5, May 2008, Abstract, 1 page.
Jun Yu et al. "Isotopically Enriched 10BN Nanotubes" Adv. Mater. 2006, 18, pp. 2157-2160.
Jun Yu et al. "In Situ Formation of BN Nanotubes during Nitriding Reactions" Chem. Mater. 2005, 17, pp. 5172-5176.
Jun Yu et al. "Influence of nitriding gases on the growth of boron nitride nanotubes" J Mater Sci (2007) 42:pp. 4025-4030.
Kyungsuk Yum et al. "Measurement of Wetting Properties of Individual Boron Nitride Nanotubes with the Wilhelmy Method Using a Nanotube-Based Force Sensor" Nano Letters 2006 vol. 6, No. 2, pp. 329-333.
Hongzhou Zhang et al. "Conical Boron Nitride Nanorods Synthesized Via the Ball-Milling and Annealing Method" J. Am. Ceram. Soc., 89 [2], pp. 675-679, 2006.
Yan_wen et al., "Direct Growth of Boron Nitride Nanotubes Film on Nickel Substrate," Journal of Nanjing University of Posts and Telecommunications (Natural Science), 28(1):83-86 (Feb. 2008) with English language abstract.

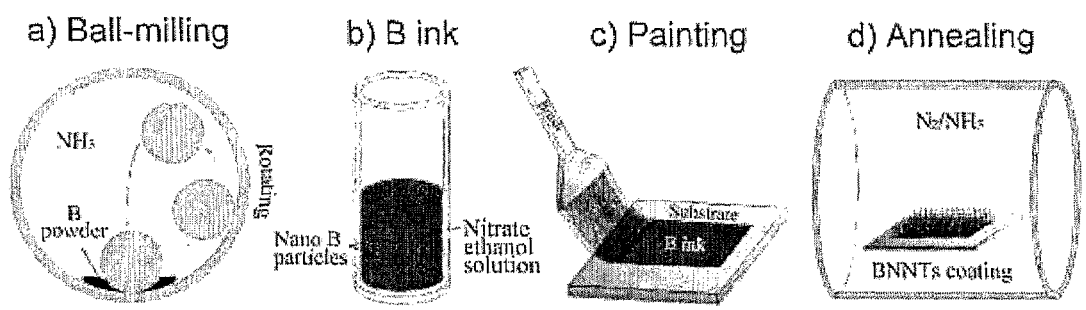
Figures 1a)-d)

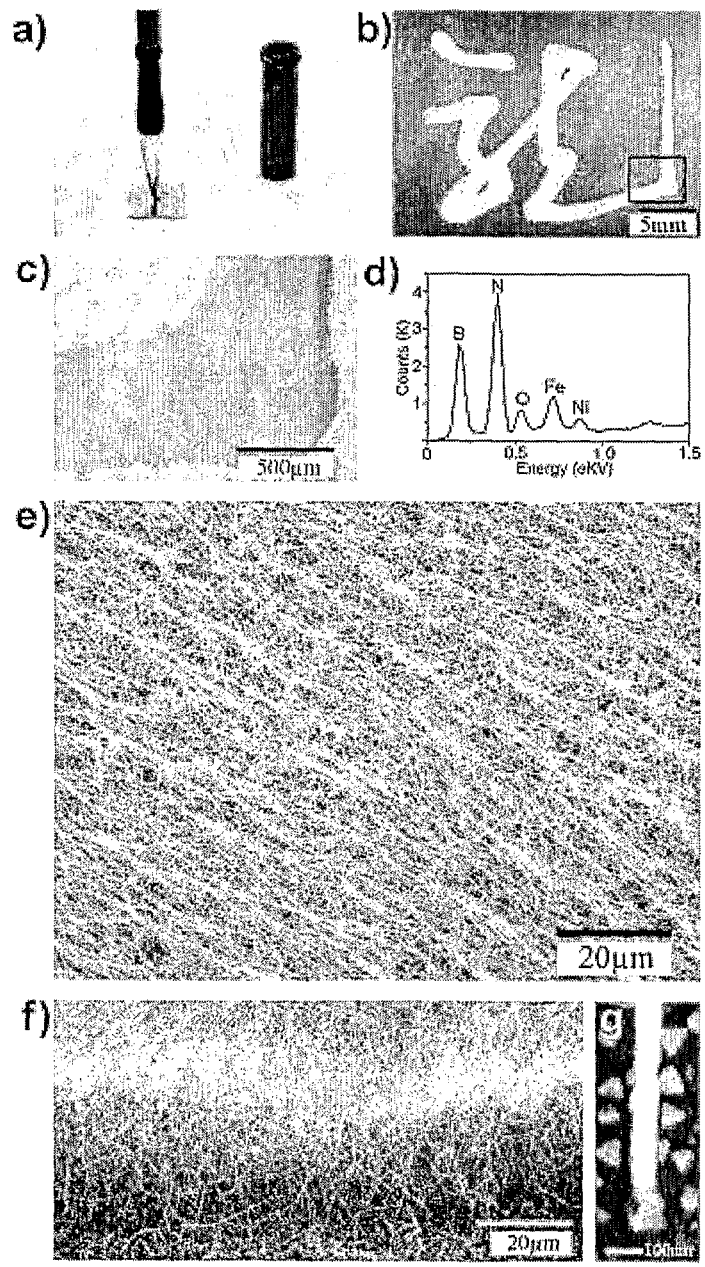
Figures 2a)-f)

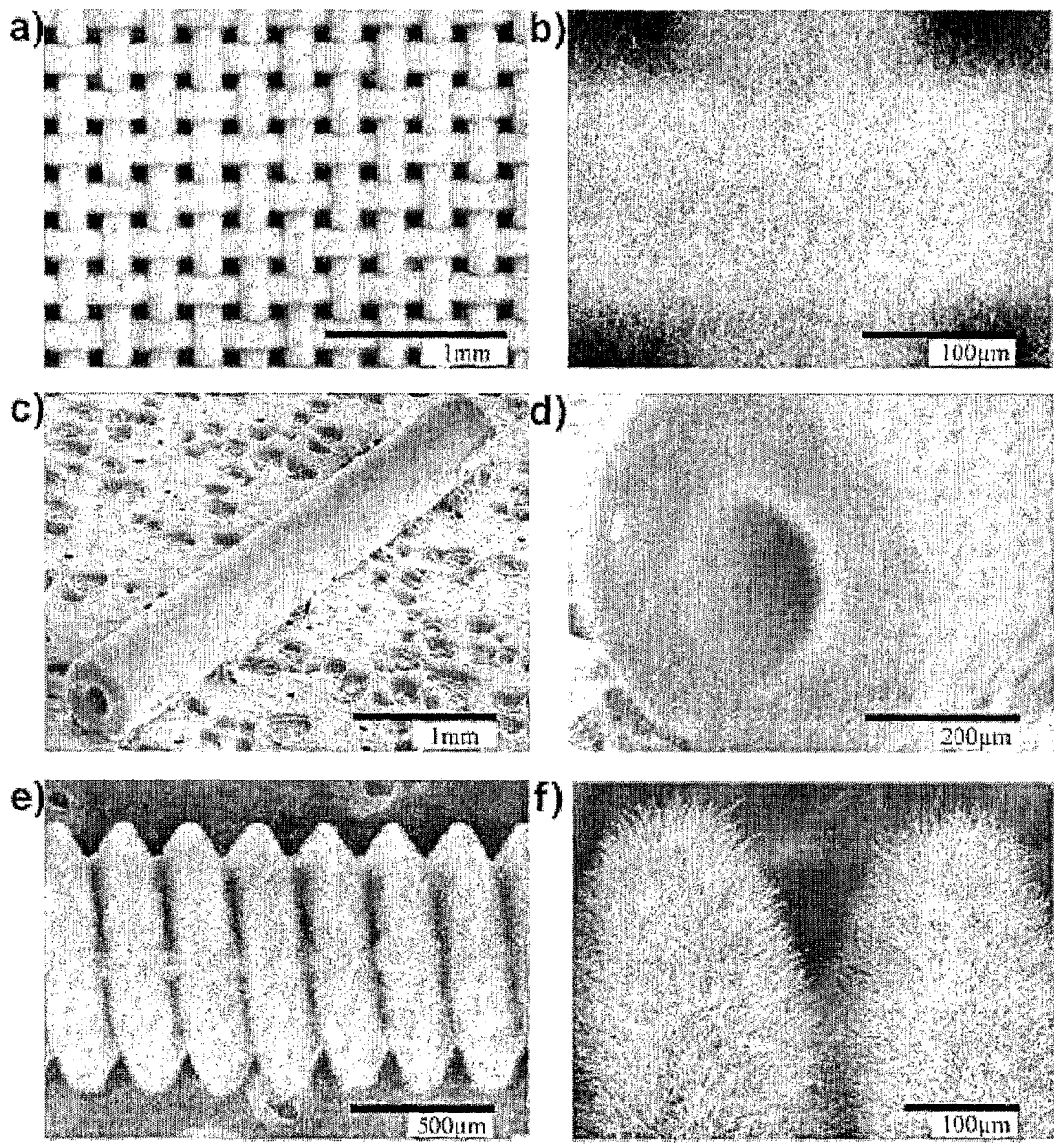
Figures 3a)-f)

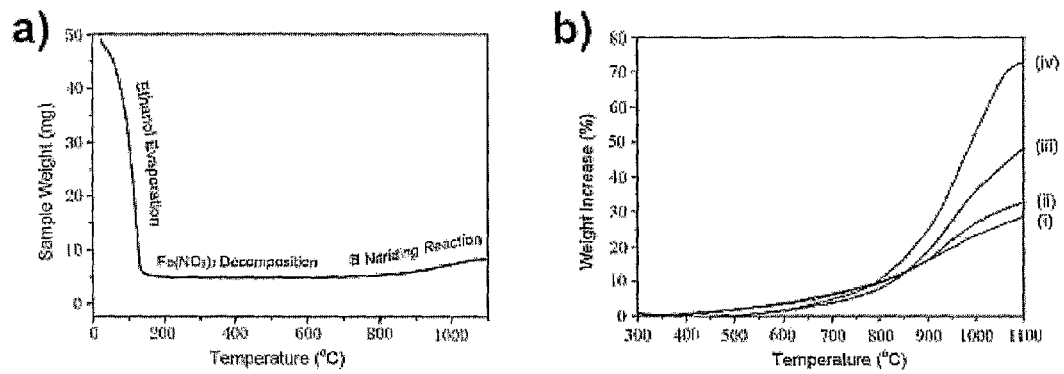
Figures 4a) and b)
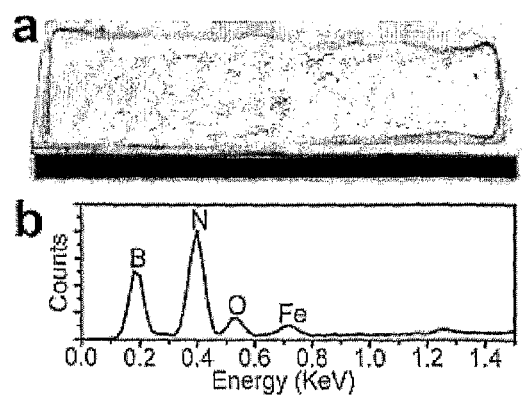
Figures 5a) and b)

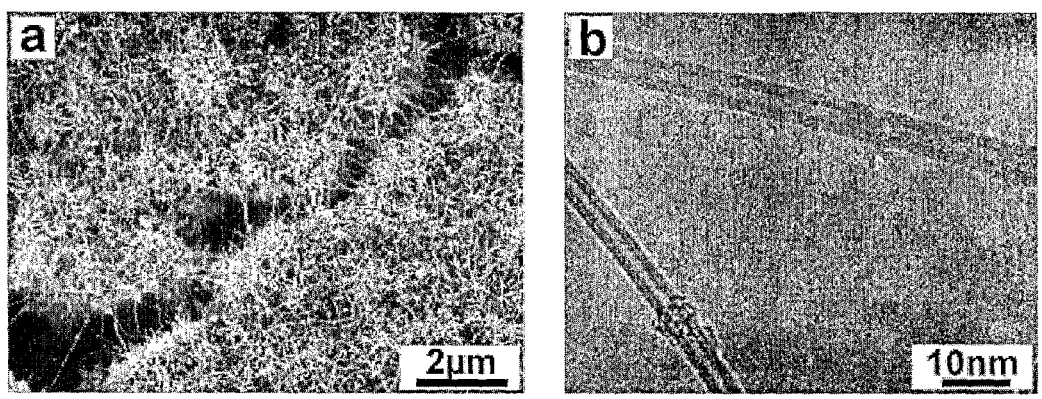
Figures 6a) and b)

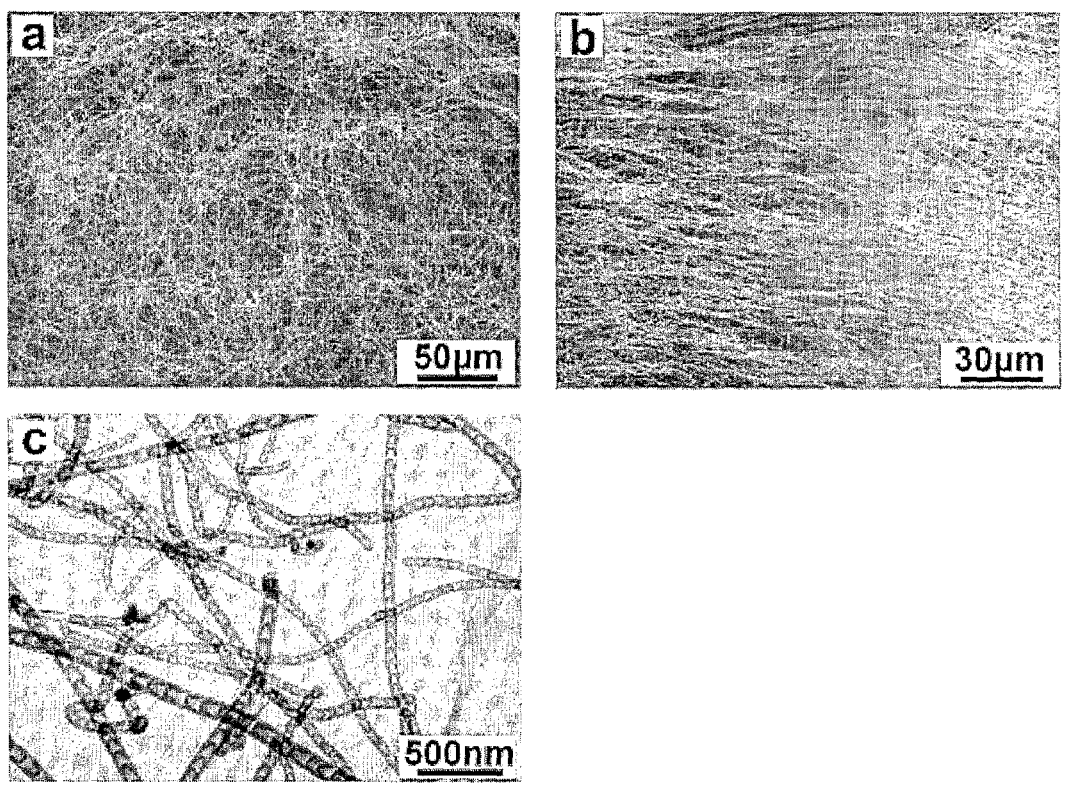
Figures 7a)-c)

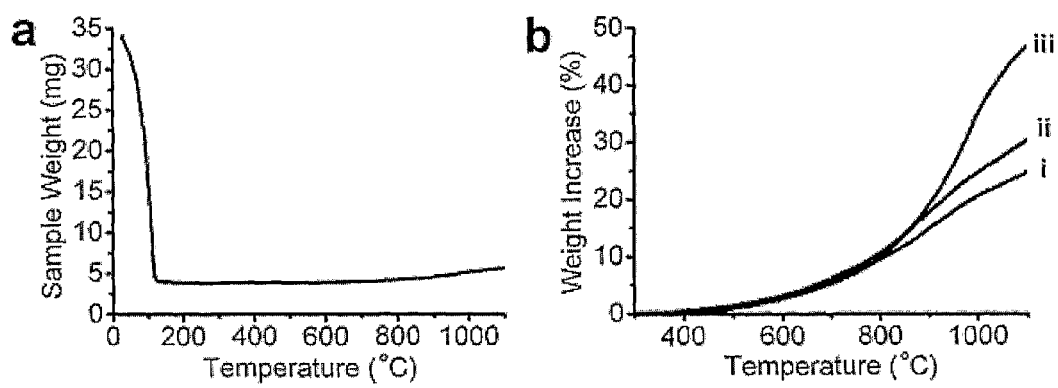
Figures 8a) and b)
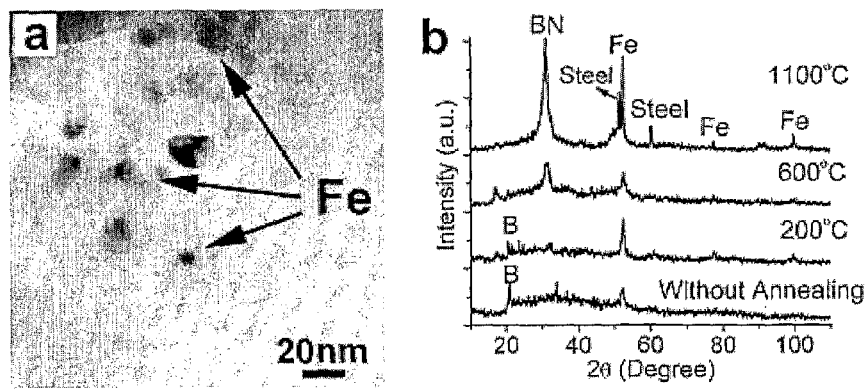
Figures 9a) and b)

METHOD OF MANUFACTURE

CROSS-REFERENCE TO RELATED APPLICATIONS

This application is a U.S. National Phase Application of International Patent Application No. PCT/AU2010/001226 Filed Sep. 20, 2010, which claims the benefit of Australian Patent Application Serial No. 2009904566 filed Sep. 21, 2009, both of which are incorporated herein by reference.

The present invention relates to a process for the production of boron nitride nanotubes, for example, on a substrate. The boron nitride nanotubes may be provided on the substrate in the form of a film. The process uses a boron particle containing ink and the invention also relates to this ink. The invention also relates to a substrate coated with boron nitride nanotubes produced in accordance with the invention, and to the practical application of such substrates.

BACKGROUND

Boron nitride nanotubes (BNNTs) have been found to exhibit many interesting and practically useful properties, and BNNTs have therefore been attracting more and more attention. Such properties include:
  excellent thermal conductivity;
  excellent mechanical properties;
  strong oxidation resistance and high temperature stability (chemically benign at high temperature);
  stable wide bandgaps (close to 6 eV);
  excellent radiation shielding (due to the presence of isotopic $^{10}B$);
  excellent piezoelectric properties; and
  optoelectronic properties.

With such premium and desirable properties BNNTs have a wide range of potential applications. However, a typical requirement then is that it is necessary to provide the BNNTs in high-purity and large quantities, and as thin films at selected locations (this is critical for integration into functional devices) with appropriately high density and with appropriately high purity. Furthermore, it is also important that the BNNTs can be provided on a commercial production scale and economically. The present invention seeks to provide a process for providing BNNTs that meets these various requirements. In an embodiment of the invention the BNNTs are produced on a substrate.

Accordingly, in one embodiment the present invention provides a process for producing boron nitride nanotubes, which process comprises heating a liquid composition comprising boron particles and a metal compound, wherein heating takes place at a temperature of from 800-1300° C. in a gaseous atmosphere containing nitrogen that causes boron nitride nanotubes to grow, and wherein the boron particles have an average particle size of less than 100 nm, and wherein the metal compound is selected such that it promotes the growth of boron nitride nanotubes during heating. The liquid composition comprises a vehicle in which the boron particles are dispersed. The metal compound may be dispersed or preferably dissolved in the vehicle.

In this embodiment of the invention BNNTs can be grown as loose form (clusters) by heating of the ink in a suitable vessel/boat. The vehicle in the ink vaporises rapidly during heating (if ethanol is used this vapourises at about 90° C.). Solid B and metal nanoparticles precipitate, and they react with nitrogen at 1100° C. The BNNTs may then be harvested and used as necessary.

In accordance with the present invention it is possible to grow BNNTs on a substrate by application of boron particles and metal compound to the substrate, at least the boron particles being provided as a liquid formulation. The present invention will be discussed with particular emphasis on this embodiment although it will be appreciated that much of the following discussion will have applicability to the embodiment in which BNNTs are grown from within the bulk of a liquid composition rather than on the surface of a substrate.

Accordingly, in one embodiment the present invention provides a process for producing boron nitride nanotubes on a substrate, which process comprises the following steps:
(a) applying to the substrate a metal compound and boron particles, the boron particles having an average particle size of less than 100 nm and wherein the boron particles are applied in the form of a liquid composition comprising the boron particles dispersed in a vehicle;
(b) heating the substrate at a temperature of from 800-1300° C. in a gaseous atmosphere containing nitrogen thereby causing boron nitride nanotubes to grow on the substrate; and
wherein the metal compound is selected such that it promotes the growth of boron nitride nanotubes during heating step (b).

In another embodiment, the present invention provides a process for producing boron nitride nanotubes on a substrate which process comprises the following steps:
(a) coating the substrate with a metal compound dissolved or dispersed in a vehicle;
(b) applying to the coated substrate an ink comprising boron particles having an average particle size of less than 100 nm; Using injet printing, brush painting, spraying and other processes
(c) heating the substrate at a temperature of from 800-1300° C. in a gaseous atmosphere containing nitrogen thereby causing boron nitride nanotubes to grow on the substrate, in rorating/tilting tube furnaces
wherein the metal compound is selected such that it promotes the growth of the boron nitride nanotubes during heating in step (c).

In accordance with the present invention it has been found that the use of particular metal compounds is effective in promoting the growth of BNNTs from boron particles provided on a substrate. Without wishing to be bound by theory it is believed that during the heating step the metal compound is reduced to the corresponding metal and it is this metal that acts as a catalyst (or nucleation site) that promotes the formation and growth of BNNTs from the boron particles provided on the substrate surface.

Herein the term "liquid composition" is used interchangeably with the term "ink".

The use of an ink containing boron particles is also an important aspect of the present invention. Use of the ink enables (at least) the boron particles to be applied onto a substrate by a variety of techniques (such as inkjet printing, brushing/painting, spraying and the like) and also allows coating according to any desired configuration. It has also been found that certain vehicles used for formulation of the ink can have a beneficial effect on the production and growth of the BNNTs.

The present invention also provides an ink comprising boron particles that is suitable for use in the process of the invention.

The present invention also provides a substrate comprising on a surface of the substrate boron nitride nanotubes produced in accordance with the present invention. The boron nitride nanotubes may take the form of a film on the substrate. The invention also extends to the use of such coated substrates.

DETAILED DESCRIPTION

In accordance with the present invention an ink is used to facilitate application of boron particles onto the surface of a substrate upon which it is desired to grow BNNTs. The ink comprises boron particles having a particular size characteristic, and a vehicle. The vehicle is intended to allow uniform distribution of the boron particles and to render the particles susceptible to application to the substrate in a desired configuration, as might be necessary. The use of an ink also enables application of the boron particles to a substrate by a variety of conventional and convenient application techniques. Use of an ink also allows flexibility with respect to loading of boron particles and this can influence the characteristics, for example, the concentration density of BNNTs that are produced.

In its simplest form the ink comprises the boron particles and vehicle only. However, in embodiments of the invention it may be desirable to include other functional components in the ink. For example, it may be desired to increase the viscosity of the ink by addition of a thickening agent. It may also be desirable to include in the ink a metal compound component, and this will be discussed in more detail later.

Typically, the ink is prepared by simple blending of the constituent components in the required proportions.

The boron particles used in the ink have a particular average size characteristic, that is the particles have an average particle size of less than 100 nm. Generally, the average particle size is from 10 nm to 100 nm.

Boron particles suitable for formulation in an ink for use in the present invention may be commercially available. However, in accordance with a preferred embodiment of the invention the particles are produced by milling of larger sized boron particles with the ink being formulated following milling. In this embodiment larger sized boron particles (average particle size >500 nm, for example up to about 1 mm) may be milled in a ball mill. Milling must take place in a suitably dry and inert gas atmosphere, such as anhydrate ammonia, argon, nitrogen and the like. Preferably, anhydrate ammonia is used. Milling generally takes place at ambient temperature and at elevated pressure, for example from 200-300 kPa.

When ammonia is used it has been observed that the pressure decreases initially followed by a gradual increase in pressure. This suggests a nitride reaction between boron and ammonia occurs during milling. The initial pressure reduction is believed to be due to absorption of ammonia gas onto surfaces of particles freshly created by milling. A rise in pressure is believed to be due to dissociation of ammonia and release of hydrogen gas and to a nitriding reaction between boron and atomic nitrogen. Unreacted nitrogen or nitrogen-containing species may contribute nitrogen to the milled particles, and this may also be beneficial with respect to subsequent formation of BNNTs in accordance with the present invention. The result of ball milling is thought to be a chemically activated structure in which the boron particles are reduced in size and include nitrogen adsorbed onto the surface.

Advantageously, milling takes place using hardened steel balls and it has been found that this can lead to some transfer of small amounts of iron in particulate form (typically <100 nm) from the balls to the boron powder. Iron is a metal that has been found to promote formation and growth of BNNTs in the process of the present invention and so production of boron particles in this way is of benefit to the overall intent of the process. In this regard it may also be preferable to undertake milling in a reducing atmosphere as hydrogen may embrittle the steel balls thereby enhancing transfer of iron to the milled boron particles. The average particle size of the metal particles used has been found to correlate with the average diameter of the BNNTs that are produced.

The duration of milling to produce the requisite average particle size will vary depending upon the characteristics and efficiency of the particular ball mill being used. Conventional quality control methodology may be applied to assess the characteristics of the boron particles produced during the milling operation.

Boron particles of the required average particle size are formulated into an ink by dispersal in a suitable vehicle. Formulation of the ink should take place in an inert atmosphere, such as in a nitrogen shroud, to avoid any oxidation of ink components. Other components may be added during this formulation process. Generally, the ink is formulated by stirring, or preferably by application of ultrasonic vibration. Ultrasonic vibration has been found to break up agglomeration/clusters of boron particles that might otherwise exist and so aid formation of an ink having a uniform distribution of boron particles. Heating (<60° C.) may be applied in the ink formulation step if necessary to aid dissolution of other ink components that may be used.

The ink may be formulated immediately prior to use, or it may be prepared and stored for later use. In either case the ink should be maintained in an inert or reducing atmosphere.

If the ink has been prepared and stored, it may be necessary to agitate it thoroughly, for example using ultrasound, prior to use to ensure a uniform distribution of boron particles.

Another important aspect of the invention is the use of a metal compound to promote growth of BNNTs on a substrate. The metal compound contributes catalytically active metal to the process over-and-above any metal that may be present with the boron particles as a result of how the particles have been prepared, for example by ball milling as described. Typically, metal that is present with the boron particles as a result of the process by which the particles are produced is not present in an amount that will yield a suitable concentration of BNNTs with any degree of efficiency. The use of a metal compound distinct from any metal/metal compound attributable to particle production remedies this and offers enhanced flexibility with respect to production of BNNTs.

In a preferred embodiment the metal compound is provided as a component of the ink containing boron particles. The metal compound may be dispersed in the ink as fine particles. However, it is preferred that the metal compound is dissolved in the ink. In this case the vehicle used to formulate the ink must be capable of solubilising the metal compound and also dispersing the boron particles as required. In this embodiment the present invention provides a process for producing boron nitride nanotubes on a substrate, which process comprises the following steps:

(a) applying to the substrate an ink comprising boron particles dispersed in a vehicle and a metal compound dissolved or dispersed in the vehicle, wherein the boron particles having an average particle size of less than 100 nm;

(b) heating the substrate at a temperature of from 800-1300° C. in a gaseous atmosphere containing nitrogen thereby causing boron nitride nanotubes to grow on the substrate, wherein the metal compound is selected such that it promotes the growth of the boron nitride nanotubes during heating in step (b).

A variety of metal compounds may be used in practice of the invention and useful metals may be determined experimentally to ascertain the activity and efficacy of any metal. Typically, the metal is selected from one or more of Fe, Cr, Ni, Co, Mo and W.

In the preferred embodiment described the metal compound is used in the form of a salt that is readily soluble in the vehicle that is used to formulate ink. In practice the salt may be selected on the basis of the vehicle, or vice versa. Typically, the salt will be a nitrate salt and this may be beneficial also since it contributes nitrogen to the overall reaction system. The use of $Fe(NO_3)_3$ and $CO(NO_3)_3$ have been found to be especially useful.

In general terms when the vehicle must solubilise the salt, water or a polar organic solvent such as methanol or ethanol is used. The use of ethanol may be particularly beneficial, as will be discussed. In this embodiment the ink may be formulated in any suitable order. Typically, the metal compound may be dissolved in the vehicle first with subsequent addition of boron particles and suitable mixing. By way of example, solutions of 0.01M-0.05M $Fe(NO_3)_3$ or $Co(NO_3)_3$ in ethanol may be used. Generally, the ink will include 10-30 wt % boron particles and 5-15 wt % (100-300 mg of B in 1-2 ml solution) metal compound. The amount of metal contributed to the ink by the metal compound is usually 1-5 atom % of B (optimal metal/B ratio is about 2 at %).

As noted, in another embodiment the metal compound may be dispersed, rather than dissolved, in the vehicle. This may increase the combinations of metal compound and vehicle that may be used since the metal compound is then not required to be soluble in the vehicle. In this embodiment the metal compound and boron particles can be blended with the vehicle in any order. The amounts of vehicle, metal compound, metal and boron particles are as noted above.

In another embodiment the metal compound may be provided (coated) on the substrate independently of the boron particle containing ink. In this case metal compound may be dissolved or dispersed in a suitable liquid, along the lines described above for ink formulation. The liquid containing the metal compound is then coated on to the substrate with the boron particle containing ink being applied subsequently so that the ink contacts the coating of metal compound. The liquid containing metal compound may be dried or allowed to dry before application of the ink but this may not be necessary.

In the embodiments of the invention the various constituents are suitably compatible so that no segregation or reaction of constituents takes place during ink formulation or application to a substrate. Preferably, the ink (and liquid containing metal compound if separately used) coats/wets the substrate without difficulty. It may be necessary to use a surfactant in the ink or on the substrate to aid wetting if there are compatibility issues that impede implementation of the invention.

Irrespective of how the boron particles and metal compound are provided onto the substrate, i.e. separately or together in a single ink, once coated the substrate is subjected to annealing (heating) in a nitrogen-containing atmosphere. The atmosphere may include molecular nitrogen ($N_2$) or nitrogen may be present in compound form, such as $NH_3$. When $N_2$ is used it may be preferable to use a mixed gas comprising $N_2$ and $H_2$, typically $N_2$-5% $H_2$. The presence of hydrogen has been found to be significant. The nitrogen-containing gas is preferably caused to flow over the coated substrate rather than remain static. This ensures that fresh reactant (nitrogen) is available for reaction with boron. Heating is continued until BNNTs of required dimensions are achieved. The BNNTs produced may be assessed and characterised by a variety of analytical techniques, for example using electron microscopy.

The annealing step may take place in a suitably adapted furnace. However, in a preferred embodiment an increase in nanotube production may be achieved using a rotating tube furnace. This type of furnace allows powders to be heated and agitated using a rotating drive system so that all the powder is exposed to the reaction gases, achieving full nitridation. The tube furnace typically has a long heated length of 1200 mm with stable temperature. The speed of rotation can be adjusted from 5-15 rpm ensuring powders are fully exposed to gases. A tilting furnace may also be used to achieve the same effect.

Compared to a stationary horizontal tube furnace, the rotating furnace has the following advantages in BN nanotube synthesis:

More material can be processed at any one time under an inert atmosphere as B powders roll along with the rotating furnace tube and can react fully with reaction gases A rotating heating tube ensures minimal agglomeration and better dispersion of nanotubes Higher tube density due to full nitridation of B powders The rotating tube furnace is mainly used for producing large quantities of loose BN nanotubes.

The gas that is used in the annealing step may influence the characteristics of the BNNTs produced. Thus, when a mixed gas of $N_2/H_2$ is flushed over the coated substrate BNNTs tend to be produced more rapidly when compared with the use of $NH_3$. As a result, for the same annealing time, the use of $N_2/H_2$ may lead to the formation of longer BNNTs when compared with the use of $NH_3$.

The concentration of boron particles in the ink and/or the thickness of ink applied to the substrate may influence the concentration density of BNNTs that are produced.

The process of the present invention has many advantages when compared to other coating processes. First, it is more flexible and controllable. Second, for the first time, BNNTs can be easily grown on objects with complicated surfaces. Third, the nanotube size, density and orientation of BNNT films are controllable by suitable manipulation of process variables. Fourth, large-area surface coating is achievable since the ball-milling and ink making large quantities of nanosized B particles available at low cost.

BNNT coated substrates have a large range of potential applications, including in new laser devices, solid-lubricant machining parts, field-emission tips, etc. Aligned BNNTs coated on a silica substrate can be used as new luminescent materials for light emission in DUV range (<300 nm); BNNTs coated on the surfaces of the machining parts running at high speeds under high temperatures have solid lubricant effects; BNNTs formed on substrate surfaces can be readily made into field-emission and other electronic devices. BNNTs coated on various substrates can protect them from oxidation and other chemical attacks.

BRIEF DESCRIPTION OF DRAWINGS

Embodiments of the present invention are illustrated in the accompanying non-limiting drawings in which:

FIG. 1 is a schematic illustrating the process of the present invention;

FIG. 2a) is a photograph illustrating the printing of a B ink on a substrate. The Figure shows an ink being applied to a stainless steel substrate by brushing.

FIGS. 2b) and 2c) are photographs of the ink applied as per FIG. 2a) after heating indicating the formation of BNNT coating on the substrate. FIG. 2b) is an optical photomicrograph of ink after annealing. The ink takes the form of a calligraphy pattern. FIG. 2c) is an SEM image of part of the calligraphy pattern shown in FIG. 2b).

FIG. 2d) is an EDS spectra for BNNTs formed in accordance with the present invention;

FIGS. 2e)-f) are SEM images showing BNNTs produced in accordance with the present invention;

FIGS. 3a)-f) are SEM images showing BNNTs produced in accordance with the present invention on various surfaces (a steel mesh in FIGS. 3a) and 3b), a steel tube in FIGS. 3c) and 3d) and a steel screw in FIGS. 3e) and 3f));

FIGS. 4a) and b) are TGA curves showing the relationship between sample weight and temperature;

FIG. 5a) is a photograph of a white BNNT layer formed in an alumina crucible (top inner dimensions 68 mm×19 mm) in accordance with the present invention;

FIG. 5b) is an EDS spectra for the BNNTs of FIG. 5a) showing elements B and N dominate the sample, along with some O and Fe;

FIGS. 6a) and b) are SEM and TEM images showing BNNTs produced in accordance with the present invention. The BNNTs are produced in $NH_3$ gas at 1300° C. The TEM image reveals small diameters and cylindrical structures of the nanotubes.

FIGS. 7a)-c) are SEM images showing BNNTs produced in accordance with the present invention. The BNNTs are pure and produced in $N_2$-5% $H_2$ gas at 1100° C. FIG. 7b) shows the aligned BNNTs found near the crucible edge. FIG. 7c) shows that most of these nanotubes with bamboo-like structure and metal catalysts on the tips.

FIGS. 8a) and b) are TGA curves showing the relationship between sample weight and temperature under different sample conditions. The TGA curve in FIG. 8a) shows the B ink weight changes during annealing in $N_2$-5% $H_2$ gas up to 1100° C. The three TGA curves in FIG. 8b) compare the nitriding reaction rates: i: ball-milled dry B particles, ii: ball-milled B particles with pure ethanol, and B ink or ball-milled B particles mixed with $Fe(NO_3)_3$ in ethanol solution.

FIG. 9a) is a TEM image of B ink after 800° C. annealing in $N_2$-5% $H_2$ gas.

FIG. 9b) is an XRD graph showing the BN phase forming process with increasing temperature.

Inkjet printing is compatible with the B ink coating method, because the ink contains nanosized B particles (diameter around 40 nm), which can easily pass through printer's nozzle.

FIG. 1 shows schematically an embodiment of the present invention. According to this figure, the process includes 4 basic stages as follows.
(1) Ball-milling of boron powder. In this step amorphous B powder (average particle size >500 nm) is subjected to ball milled (with steel balls). This generally takes place under an atmosphere of anhydrate ammonia ($NH_3$) at elevated pressure. Milling is continued until a suitable B average particle size is obtained (less than 500 nm).
(2) B ink preparation. The milled B powder is dispersed in a vehicle (e.g. ethanol) with small amounts of a metal catalyst compound, such as ferric (or other suitable metal) nitrate, to form an ink. The ink is usually subjected to ultrasonic treatment to break up large B clusters and homogenize the dispersion of (nano-sized) B particles.
(3) Ink coating. The B ink is coated (e.g. by brushing, spraying or printing) on the surface of a substrate where BNNT are intended to be grown. The pattern and thickness of coating can be easily controlled by the coating process.
(4) Heating (thermal annealing). The final step results in growth of BNNT thin films by suitable heating of the coated substrate. This may take place in a suitable furnace, for example a horizontal tube furnace, under controlled conditions, such as, at 800-1300° C. in a gas flow of $N_2$-5% $H_2$ or $NH_3$. A nitriding reaction between the B ink and the nitrogen-containing atmosphere results in the formation of BN in nanotube form. The metal catalyst in the ink is believed to act as a catalyst for promoting BNNT growth.

FIG. 2a shows a B ink (B content of 62.5 mg ml$^{-1}$ in 0.04 M $Fe(NO_3)_3$ ethanol) being brushed onto a stainless steel plate using a paint brush. A complicated pattern (traditional Chinese calligraphy in this case) was created with the brush on the substrate to demonstrate full flexibility and controllability in large-area patterning (see FIG. 2b).

After annealing of the painted substrate at 1100° C. for 30 mins in $N_2$-5% $H_2$ atmosphere, a white layer was formed only on the painted surfaces. SEM images, taken from the right-bottom corner of the character pattern (square area in FIG. 2b), reveals a layer of BNNTs (FIG. 2c). The enlarged image in FIG. 2e shows nanotubes with diameters in the range of 50-80 nm.

The chemical nature of the thin film of nanotubes is BN as determined by EDS analysis, and the obtained spectrum is displayed in FIG. 2d. Oxygen is from surface contamination, and Fe and Ni come from catalysts (which originate from stainless steel container and hardened steel balls used in the milling step) included in the ink. FIG. 2f shows the thickness of the nanotube layer to be around 30 μm and most nanotubes have one end attached to the substrate surface as shown by another SEM micrograph (FIG. 2g), which enables the BNNT film to adhere firmly on the substrate. Even after exposure to a high-pressure air flow at a short distance, the nanotubes still remained on the substrate, but aligned to the air flow direction as seen in FIG. 2e. TEM analysis of the BNNTs revealed typical multi-walled cylindrical structures.

The nanotube size and density can be adjusted. The diameter of the BNNTs can be changed by using different heating/annealing conditions, including temperature, time and gaseous environment. For example, annealing in $NH_3$ gas at 1300° C. for 30 mins produces nanotubes with diameters less than 10 nm, while annealing in $N_2$-5% $H_2$ gas for 30 mins at 1100° C. produces nanotubes with diameters in the range 50-80 nm and length up to several hundred micrometers. This is believed to be due to different nitriding reaction rates.

Generally, the heating time will vary depending upon the quantity and dimensions of BNNTs to be produced. Typically, a relatively short heating time may be sufficient to produce a thin film of BNNTs on a substrate, whereas a relatively long time may be required to produce BNNTs in loose form from (the bulk of) an ink.

The thickness of the BNNT layer depends on the quantity of ink painted on. Spraying or printing diluted B inks (such as, 30 mg ml$^{-1}$ in 0.02 M $Fe(NO_3)_3$ ethanol) can produce BNNT films with relatively low nanotube densities.

In addition to coating on flat substrates, the methodology of the present invention can also be used to grow BNNTs on more complicated surfaces of irregular shaped objects by brushing, spraying, dipping and other coating techniques. For example, FIG. 3a shows a mesh of steel wires of diameter around 150 μm upon. High-density, pure BNNTs have been grown on the surface of each wire as can be seen on the enlarged SEM image (FIG. 3b). The BNNT coating was formed by thoroughly brushing the mesh with a B ink, then heating at 1100° C. for 30 mins in $N_2$-5% $H_2$ gas.

FIG. 3c shows a BNNT coating on a steel tube with an external diameter of 500 μm and an inner diameter of 250 μm. The tube was first immersed in a B ink so that the internal and external surfaces were also covered by a layer of the ink. During the subsequent annealing, the steel tube was placed along the direction of $N_2$ gas flow inside a tube furnace to allow the gas to flow through the tube. The nitriding reaction occurred inside the steel tube and on the outside of the tube. Thus, BNNTs were formed on the external and internal surfaces of the tube as shown by the SEM image in FIG. 3d. BNNTs were found to be standing inside the steel tube tunnel.

FIG. 3e is a SEM micrograph of a small steel screw coated with BNNTs. The screw has a diameter 0.9 mm and thread dimension of 200 μm. FIG. 3f shows that BNNTs are formed homogenously on the surfaces of the screw and stand vertically on the surfaces. The BNNTs have been found to improve the oxidation resistance and wear resistance of the screw surfaces.

The following non-limiting examples illustrate embodiments of the present invention.

Example 1

The formation process of BNNTs from a B ink has been investigated using TGA by monitoring the nitriding reaction process by following sample weight changes during heating. A typical TGA curve of a B ink (133.3 mg ml$^{-1}$ of B in 0.1 M Fe(NO$_3$)$_3$ ethanol) is shown in FIG. 4a. During heating to 1100° C. at a rate of 20° C. min$^{-1}$ in 50 ml min$^{-1}$ N$_2$-5% H$_2$ flow, the TGA curve shows three different stages corresponding to three important physical and chemical changes of the B ink. In the first stage from room temperature to about 145° C., a sharp reduction in sample weight of from around 48.7 to 5.6 mg is observed. This is believed to be due to ethanol evaporation (ethanol boiling point at 78.4° C.). In the second stage from about 145 to about 400° C., sample weight slightly decreases by 0.85 mg and then remains stable. This change is attributed to the decomposition of Fe(NO$_3$)$_3$ into Fe$_2$O$_3$ and gaseous phases NO$_2$ and O$_2$. The Fe$_2$O$_3$ is subsequently reduced by hydrogen to nanosized metal particles which act as catalysts/nucleation sites for growth of BNNTs. In the third stage from about 800 to about 1100° C., the sample weight increases rapidly because of the nitriding reaction between B and N with the formation of BN phases. X-ray diffraction analysis and SEM observation have been used to confirm the above structural changes and chemical reactions in the three annealing stages. Further TGA analyses suggest that all three ink components (B particles, ethanol, and nitrate) play crucial roles in the formation of pure, high-density BNNTs.

In an embodiment of the present invention, high-energy ball milling of B powder in a suitable gaseous environment, such as ammonia, is a first key step, as it yields nanosized B particles with disordered and metastable structures. The resultant particles are so chemically active that they can be converted to BN at temperatures from 800 to 1300° C. At these relatively low temperatures, the formation of the nano-sized tubular structure is more favorable than large three-dimensional crystal growth. Small Fe particles from steel milling media are also introduced into the B powder during the milling process, and these Fe particles are available to act as catalysts/nucleation sites to promote BNNT growth.

In this embodiment the vehicle in the ink, typically ethanol, also plays an important role in the process. It allows formation of an ink that allows one to cover substrate surfaces uniformly with B powder, even complicated surfaces. It also allows various coating techniques (brushing, spraying, dipping and printing) to be used in particular. Ethanol has also been found to enhance the B nitriding reaction slightly. The TGA curve in FIG. 4b (curve (ii)) shows 4.5% more BN is formed when pure ethanol was added to dry milled B powders. This is believed to be because ethanol can prevent oxidation of the milled B powder. Furthermore, ethanol does not leave C and O contaminants in the final BNNT product. Ethanol evaporates completely below 145° C. and the vapor is flushed away by gas flow. EDS analysis confirms the absence of C in the final BNNTs by the spectrum shown in FIG. 2d.

Ferric nitrate (or other suitably active metal nitrate or metal compound) is needed as catalyst because the Fe particles from the milling process are generally not enough for high yield formation of BNNTs. The catalytic effect of the nitrate can be seen from the TGA curves presented in FIG. 4b. This figure shows three curves for samples with different nitrate contents: B ink (133.3 mg ml$^{-1}$ of B in pure ethanol) without any nitrate (curve (ii)), B ink with 0.04 M Fe(NO$_3$)$_3$ (133.3 mg ml$^{-1}$ of B in 0.04 M Fe(NO$_3$)$_3$ ethanol solution) (curve (iii)), and B ink with 0.1M Fe(NO$_3$)$_3$ (133.3 mg ml$^{-1}$ of B in 0.1 M Fe(NO$_3$)$_3$ ethanol solution) (curve (iv)). Curve (i) relates to the use of dry ball milled B powder.

Curve (ii) has a weight increase of only 33.3%, indicating incomplete nitriding reaction under the heating conditions used. Much higher weight increases are detected from the B ink samples when ferric nitrate was added. The TGA curves (iii) and (iv) show 48.7% and 73.1% weight increases for the inks with the Fe(NO$_3$)$_3$ contents of 0.04 M and 0.1 M, respectively. The XRD pattern showed the weight increases were caused by BN formation. These indicated clearly the strong catalytic role of the nitrate. Indeed, TEM analysis on the B ink after heating at 200° C. found a large number of nano-sized iron and iron oxide particles from the nitrate.

Example 2

Ball milling treatment was conducted in a vertical rotating high-energy ball mill. Several grams of amorphous B powder (95%-97%, Fluka 300-500 μm) were sealed in an experimental steel milling vial with four hardened steel balls 25 mm in an anhydrate ammonia (NH$_3$) atmosphere at 300 kPa. The ball-to-powder ratio was 132:1. Milling was undertaken for 100 hrs at ambient temperature. The milled sample was unloaded and mixed with a ferric nitrate ethanol solution (0.03M Fe(NO$_3$)$_3$ ethanol) in a N$_2$ gas filled gloved box. Then the B ink was sealed in airtight glass bottle in the glove box for ultrasonication treatment.

A steel mesh was brushed thoroughly with the B ink (concentration 83.3 mg ml$^{-1}$ of B) without blocking the small holes on mesh with ink droplets. The brushed mesh was hung over an alumina boat and annealed at 1100° C. for 30 mins in N$_2$-5% H$_2$ gas, so that both sides of the mesh could contact with the reaction gas and thus be totally covered with BNNTs.

Separately, a steel tube was totally immersed in a B ink (62.5 mg ml$^{-1}$ of B in 0.04 M Co(NO$_3$)$_3$ ethanol) to allow ink to cover the internal and external surfaces of the tube.

Hitachi 4300SE/N and Hitachi 4500 FESEM Scanning Electronic Microscopes at 3 kV were employed to examine sample morphology, and EDS was conducted in 4300SE/N instrument at 15 kV. TEM investigations were performed using a Philips CM300 (300 kV) microscope. Sample structures were investigated using Philips 3020 X-ray Diffraction (XRD) machine. TGA was conducted using a Shimazu TGA-60 analyzer. All samples were heated to 1100° C. at a heating rate of 20° C. min$^{-1}$ in N$_2$-5% H$_2$ gas with a flow rate of 50 ml min$^{-1}$.

Example 3

Fine B particles were produced first for preparation of an ink. 2 g of amorphous B powder (95%-97%, Sigma-Aldrich 300-500 μm) were sealed in a steel rotating milling vial with four hardened steel balls 25 mm. The ball-to-powder weight ratio (BPR) was 132:1. Anhydrate ammonia (NH$_3$) as reaction gas was purged into the vial and a final static pressure of 300 kPa was established prior to milling. Ball-milling was undertaken for 150 hrs in this laboratory arrangement to ensure formation of nanosized B particles 100 nm with metastable structures.

A B ink was prepared by mixing the ball-milled B particles with ferric nitrate (98%, Sigma-Aldrich) or cobalt nitrate (98%, Sigma-Aldrich) in ethanol solution under 1 hr ultrasonic bath treatment. Ultrasonication helped to evenly disperse nanosized B particles into the solution. The ink-like solution was then poured into a crucible and isothermally annealed using a horizontal tube furnace at temperatures between 1050° C. and 1300° C. for several hours in different atmospheres: nitrogen with 5% hydrogen ($N_2$-5% $H_2$) or $NH_3$. During annealing, the B particles reacted with N-containing gases to produce BNNTs via the chemical reaction:

$$B+N \rightarrow BN$$

The BNNTs were investigated using Philips 3020 X-ray Diffraction (XRD) diffractometer. A Hitachi 4300SE/N Scanning Electronic Microscope (SEM) operated at 3 kV was employed to examine nanotube morphology. Chemical contents of nanotubes were examined using X-ray energy dispersive spectroscopy (EDS) attached to the SEM instrument. Transmission Electron Microscope (TEM) investigations were performed using a Philips CM300 (300 kV) instrument. Thermogravimetric analysis (TGA) was conducted with a Shimazu TGA-60 instrument.

Example 4

BNNTs in large quantity and high purity can be synthesized by using the B ink annealing method in accordance with the present invention. FIG. 5a shows a layer of white fluffy materials covering the bottom of a crucible (size: 68 mm×19 mm). The EDS spectra (FIG. 5b) reveals that the annealed sample was dominated by elements B and N, along with some O and Fe contaminations. The Fe was from the ball-milling process and the added nitrate in the B ink. Larger quantities of BNNTs can be produced by using a bigger crucible. For example, 0.5 g of BNNTs was synthesized in a rectangle shaped stainless steel boat with the size of 100 mm×40 mm. The morphologies and structures of the materials are discussed below.

The size and structure of BNNTs can be adjusted by adopting different annealing atmospheres and temperatures. BNNTs with cylindrical structure and small diameters were synthesized by using $NH_3$ gas in the annealing process. In this process, 0.034M $Co(NO_3)_2$ ethanol solution was chosen to prepare B ink, because Co is an effective catalyst for both $NH_3$ decomposition and BNNT growth. It may relatively increase the nitriding reaction rate and improve the nanotube yield. The SEM image in FIG. 6a shows high density of small tubes obtained after annealing in $NH_3$ at 1300° C. for 6 hrs. The tube length is mainly 3-5 μm. According to TEM investigation (FIG. 6b), they have small diameters in the range of 3-10 nm, and multi-walled, well-crystallized cylindrical structures.

When B ink (with 0.02M $Fe(NO_3)_3$ ethanol solution) was annealed in a different gas, such as $N_2$-5% $H_2$ at 1050° C. to 1100° C. for 3 hrs, longer BNNTs with larger diameters were produced. The SEM image in FIG. 7a shows that the annealed product also contains high density nanotubes with the length of 100-200 μm. The longest BNNT found under SEM was about 400 μm. The diameters are in the range of 50-80 nm. The product had very high nanotube purity, and no particles were observed. Although the majority of the nanotubes were grown in random directions (FIG. 7a), well-aligned BNNTs were often found at the edge of the crucible (FIG. 7b), which is believed to be caused by the gas flow. TEM analysis reveals most of tubes have a bamboo-like structure, and usually contain metal catalysts on the tips (FIG. 7c).

Discussion

Compared to the process of ball-milling and annealing of dry B particles, the liquid ink method greatly improves the density and purity of BNNTs. TGA was used to investigate the roles of both ethanol and nitrate in the annealing process. The TGA curve in FIG. 8a shows the weight changes of B ink during heating in $N_2$-5% $H_2$ gas. In the analysis, 0.02M $Fe(NO_3)_3$ ethanol solution was used to prepare the B ink (100 mg B in 1 ml solution), and the heating rate was 20° C./min. Three different sections related to three different physical and chemical changes of the B ink during annealing can be seen in the curve. Over the first section from room temperature to 145° C., the sample weight plummeted dramatically from 34 mg to 4 mg. This quick weight loss was caused by ethanol evaporation and flushing away by $N_2$-5% $H_2$ gas. Over the next section from 145° C. to 400° C., the sample weight stabilized. However, during this section, nitrate, $Fe(NO_3)_3$, thermally decomposed to metal oxide, $Fe_2O_3$, which would be further reduced into nanosized metal particles that act as catalysts to assist the nanotube growth. The last section is from 400° C. to 1100° C., where sample weight rebounded owing to the nitriding reaction between B particles and $N_2$ gas with the formation of BN.

Metal nitrates play an essential role in the synthesis of high density BNNTs. In ball-milled B powder, small steel particles, about 2.09 at % Fe, are formed from the high energy collisions between milling vial and balls during ball-milling. Even if no additional nitrate is added to the ball-milled particles, these metal particles can act as catalysts during BNNTs growth. However, they are generally not quantitatively sufficient or efficient enough to cause conversion of all B particles to BNNTs. Nanosized metal particles decomposed from the added nitrates in the B ink can compensate these shortfalls as evidenced by the following measurements.

The nitriding reaction rates of three samples, ball-milled dry B particles adding neither nitrate nor ethanol (i), B particles added with pure ethanol (ii), and B ink mixed with 0.02M $Fe(NO_3)_3$ ethanol solution (iii), were compared in TGA curves (FIG. 8b). In the curves, the percentage of weight increase is based on the lowest weight of each sample during annealing. For the B ink, total 46.8% weight increase was gained during heating up to 1100° C. In contrast, there were only 24.7% and 30.2% weight increases for heating ball-milled dry B particles and ball-milled B particles with pure ethanol, respectively. The higher weight gain from B ink means higher nitriding reaction rate of the B ink and more BN phases formed in the final product. Therefore, the presence of the metal nitrate is the main reason for this improvement. Detailed TGA investigations of the heating process of $Fe(NO_3)_3$ in $N_2$-5% $H_2$ gas reveal that most of $Fe(NO_3)_3$ thermally decomposes to $Fe_2O_3$ at 350° C., and then these oxides are largely reduced by $H_2$ into Fe particles at around 850° C. TEM image analysis (FIG. 9a) shows Fe particles (in dark contrast) reduced from the B ink after annealing at 800° C. in $N_2$-5% $H_2$ is as small as 5 nm, and the 20 nm particle could be steel particles from ball-milling or the agglomeration of Fe decomposed from $Fe(NO_3)_3$. And these Fe particles created more reaction sites for nitriding and act as seeds for nanotube growth. The optimized amount of $Fe(NO_3)_3$ added into ball-milled B is 0.08-0.2 mg $Fe(NO_3)_3.9H_2O$ per ling ball-milled B powder. If less $Fe(NO_3)_3$ is added, there is still not enough catalyst. If too much is added, large Fe particles may form and even react with B powder resulting in the loss of their catalytic function.

Although most of ethanol evaporates below 145° C., it still slightly enhances the BNNT growth. TGA (FIG. 8b) shows that even by adding pure ethanol into B particles without nitrate or additional Fe, there is still more weight increase than that of the annealing of dry B particles. The role of ethanol can be explained as follows. First, ethanol can help to break agglomerates of B particles during ultrasonication. Nanosized B particles normally form large agglomerates under ball impacts during milling process, which slows down the nitriding reactions, and hence reduces nanotube yield. Ultrasonic treatment in ethanol can break these large agglomerates into loose B particles that are easier to contact with reaction gases and thus enhance the nitriding reaction during annealing. Second, ethanol helps to deter the metastable B particles from oxidation. The ball-milling process produces metastable disordered B structures that are highly reactive even at room temperature in air. The oxidation of these structures may lose their chemical reactivity. The ethanol may cover surfaces of these ball-milled particles to prevent the oxidation. Third, ethanol assists homogeneously mixing of the nitrates with nanosized B particles. On the other hand, ethanol does not leave C contamination in the BNNT products, if excessive volumes are avoided. TGA (FIG. 8a) shows ethanol can be flushed away at low temperatures (below 145° C.), and thus it does not involve any chemical reaction at high temperatures. The EDS analysis from the final BNNT products does not show significant C residues (FIG. 5b).

The metastable disordered B structures produced by the ball-milling treatment can react with nitrogen containing gas at relatively lower temperature to form BN phase. XRD graphs of the B ink annealed at different temperatures in FIG. 9b clearly show the formation and increase of BN phases with the temperature increases. At room temperature, there were only disordered B structures. The (002) BN phase appeared at 600° C. At 1100° C., this peak became dominant. It is BNNTs rather than three-dimensional BN crystals that are produced in the process because the ball-milled B particles are preferable for growing one-dimensional BNNTs with the presence of metal catalysts at a lower growth temperature. The XRD results confirm the weight increases were caused by the phase changes between 400° C. to 1100° C. in TGA.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The claims defining the invention are as follows:

1. A process for producing boron nitride nanotubes, which process comprises heating a liquid composition comprising boron particles and a metal compound, wherein heating takes place at a temperature of from 800-1300° C. in a gaseous atmosphere containing nitrogen that causes boron nitride nanotubes to grow, and wherein the boron particles have an average particle size of less than 100 nm, and wherein the metal compound is selected such that it promotes the growth of boron nitride nanotubes during heating.

2. The process of claim 1, wherein the boron particles have an average particle size of from 10 nm to 100 nm.

3. The process of claim 1, wherein the boron particles are produced by milling of larger sized boron particles in a dry and inert gas atmosphere.

4. The process of claim 3, wherein milling takes place in anhydrate ammonia.

5. The process of claim 4, wherein milling takes place using hardened steel balls.

6. The process of claim 1, wherein the boron particles are produced by milling of larger sized boron particles using hardened steel balls, and wherein milling takes place in a reducing atmosphere.

7. The processing of claim 1, wherein the metal compound is selected from one or more of Fe, Cr, Ni, Co, Mo and W.

8. The process of claim 7, wherein the metal compound is used in the form of a salt that is soluble in the liquid composition.

9. The process of claim 7, wherein the metal compound is selected from $Fe(NO_3)_3$ and $Co(NO_3)_3$.

10. A process for producing boron nitride nanotubes on a substrate which process comprises the following steps:
    (a) applying to the substrate an ink comprising boron particles dispersed in a vehicle and a metal compound dissolved or dispersed in the vehicle, wherein the boron particles have an average particle size of less than 100 nm; and
    (b) heating the substrate at a temperature of from 800-1300° C. in a gaseous atmosphere containing nitrogen thereby causing boron nitride nanotubes to grow on the substrate, wherein the metal compound is selected such that it promotes the growth of the boron nitride nanotubes during heating in step (b).

11. A method of protecting a substrate against oxidation or chemical attack, the method comprising coating the substrate with boron nitride nanotubes in accordance with the process of claim 10.

12. A process for producing boron nitride nanotubes on a substrate which process comprises the following steps:
    (a) coating the substrate with a metal compound dissolved or dispersed in a vehicle;
    (b) applying to the coated substrate an ink comprising boron particles having an average particle size of less than 100 nm; and
    (c) heating the substrate at a temperature of from 800-1300° C. in a gaseous atmosphere containing nitrogen thereby causing boron nitride nanotubes to grow on the substrate, wherein the metal compound is selected such that it promotes the growth of the boron nitride nanotubes during heating in step (c).

13. A method of protecting a substrate against oxidation or chemical attack, the method comprising coating the substrate with boron nitride nanotubes in accordance with the process of claim 12.

* * * * *